US008731346B2

(12) United States Patent
Tseng et al.

(10) Patent No.: US 8,731,346 B2
(45) Date of Patent: May 20, 2014

(54) WAVEGUIDE INTEGRATION ON LASER FOR ALIGNMENT-TOLERANT ASSEMBLY

(75) Inventors: Jia-Hung Tseng, Portland, OR (US); Peter L. Chang, Portland, OR (US); Miriam R. Reshotko, Portland, OR (US); Ibrahim Ban, Beaverton, OR (US); Mauro J. Kobrinsky, Portland, OR (US); Brian Corbett, Douglas Cork (IE); Roberto Pagano, Terlizzi (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/536,329

(22) Filed: Jun. 28, 2012

(65) Prior Publication Data

US 2014/0003765 A1  Jan. 2, 2014

(51) Int. Cl.
*G02B 6/12* (2006.01)

(52) U.S. Cl.
USPC .......................................... 385/14; 372/43.01

(58) Field of Classification Search
USPC ............................ 385/14; 473/43.01
See application file for complete search history.

(56) References Cited

U.S. PATENT DOCUMENTS

| 2002/0168166 A1* | 11/2002 | Itoh et al. ................. 385/129 |
| 2004/0121520 A1* | 6/2004 | Karkkainen ............. 438/107 |
| 2005/0157766 A1* | 7/2005 | Kim et al. ................. 372/43 |
| 2006/0251360 A1* | 11/2006 | Lu et al. ...................... 385/88 |
| 2010/0215072 A1* | 8/2010 | Funabashi ............... 372/50.12 |

OTHER PUBLICATIONS

Janiak et al., "1.55 micron BH DFB laser with Integrated Spot-Size Converter for Flip-Chip Applications," 16th International Conference on Indium Phosphide and Related Materials (IPRM 2004), Kagoshima, JP, May 31-Jun. 4, 2004, p. 476.*
Vernooy et al., "Alignment-Insensitive Coupling for PLC-Based Surface Mount Photonics," IEEE Photonics Technology Letters, V. 16, No. 1, 2004, p. 269.*
Fan et al., "Tapered Polymer Single-Mode Waveguides for Mode Transformation," Journal of Lightwave Technology, V. 17, No. 3, 1999, p. 466.*
Khilo et al., "Efficient planar fiber-to-chip coupler based on two-stage adiabatic evolution," Optics Express, V. 18, N. 15, 2010, p. 15790.*
Roelkens, G. et al., "Heterogeneous Integration of III-V Photodetectors and Laser Diodes on Silicon-on-Insulator Waveguide Circuits," 3rd IEEE International Conference on Group IV Photonics, IEEE Lasers and Electro-Optics Society, Ottawa, Ontario, Canada, Sep. 13-15, 2006, pp. 188-190.
Bouadma, N. et al., "Integration of a Laser Diode With a Polymer-Based Waveguide for Photonic Integrated Circuits," IEEE Photonics Technology Letters, 6(10):1188-1190, Oct. 1994.
"Surface Mount Photonics Overview," XPonent Photonics, Inc., May 5, 2003, 18 pages.

(Continued)

*Primary Examiner* — Charlie Peng
*Assistant Examiner* — Peter Radkowski
(74) *Attorney, Agent, or Firm* — Schwabe, Williamson & Wyatt, P.C.

(57) ABSTRACT

Embodiments of the present disclosure provide optical connection techniques and configurations. In one embodiment, an apparatus includes a substrate, a laser device formed on the substrate, the laser device including an active layer configured to emit light, and a mode-expander waveguide disposed on the substrate and butt-coupled with the active layer to receive and route the light to a waveguide formed on another substrate. Other embodiments may be described and/or claimed.

21 Claims, 9 Drawing Sheets

(56) References Cited

OTHER PUBLICATIONS

"Extended Reach Fabry Perot Lasers," Technical Note, XPonent Photonics, Inc., Mar. 2003, 4 pages.

"Surface Mount Photonics—Lowering Costs by Changing the Rules for Optical Components Manufacturing," Xponent Photonics, Inc., Feb. 2004, 15 pages.

"Surface Mount Photonics," Technical Note, XPonent Photonics, Inc., Mar. 2003, 4 pages.

Vernooy, David W., "Alignment-Insensitive Coupling for PLC-Based Surface Mount Photonics," IEEE Photonics Technology Letters 16(1):269-271, Jan. 2004.

"Corporate Overview—Triplexer Chipset," XPonent Photonics, Inc., Jul. 2005, 3 pages.

* cited by examiner

WAVEGUIDE INTEGRATION ON LASER FOR ALIGNMENT-TOLERANT ASSEMBLY

FIELD

Embodiments of the present disclosure generally relate to the field of opto-electronics, and more particularly, to optical connection techniques and configurations including waveguide integration on laser for alignment-tolerant assembly.

BACKGROUND

Optical signals may be used to communicate information between integrated circuits (ICs) such as ICs formed on different dies. Present techniques to optically couple different dies may be incompatible with high volume manufacturing processes. For example, optical features of different dies may presently be aligned and coupled using active alignment techniques where a light signal is routed between the dies while fabrication equipment positions the dies relative to one another until precise alignment is achieved to provide maximum coupling (e.g., maximum light intensity, minimum coupling loss, etc.). Such precise alignment of optical features to route the light signal may be costly and time-consuming.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide optical connection techniques and configurations including waveguide integration on laser for alignment-tolerant assembly. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, front/back, over/under, side, horizontal/vertical, above/below and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
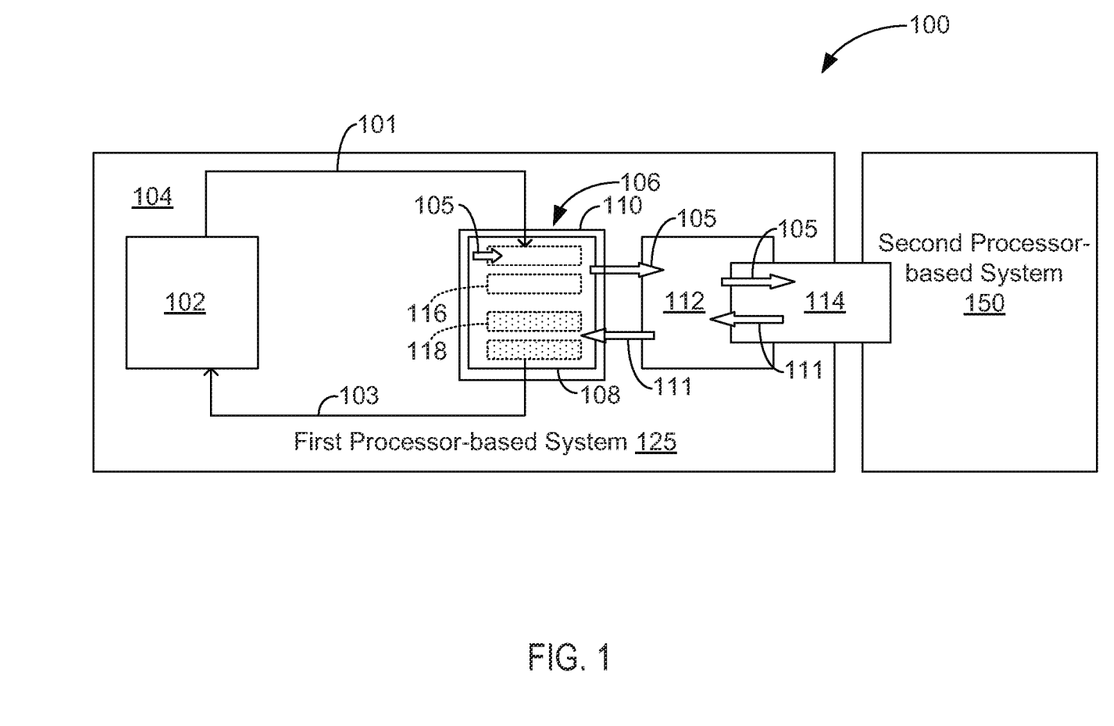
FIG. 1 schematically illustrates a top view of an example optical interconnect system, in accordance with some embodiments.

FIG. 1 schematically illustrates a top view of an example optical interconnect system 100, in accordance with some embodiments. The optical interconnect system 100 may include a first processor-based system 125 and a second processor-based system 150 coupled together using a system-level optical coupler 114 such as, for example, fiber(s) and/or waveguide(s) to route light in the form of "optical mode" signals (e.g., light 105, 111) between the first processor-based system 125 and the second processor-based system 150.

The first processor-based system 125 may include a processor 102 mounted on a substrate 104, which may be referred to as a "package substrate." The processor 102 may be operatively coupled with an opto-electronic assembly 106 that is configured to convert electrical signals such as, for example, electrical input/output (I/O) signals of the processor 102 into corresponding optical signals (e.g., light 105) for routing of the optical signals to another device configured to receive the optical signals (e.g., second processor-based system 150). The opto-electronic assembly 106 may be further configured to receive and convert optical signals (e.g., light 111) into electrical signals.

According to various embodiments, the techniques and configurations described herein may be used to optically couple two dies together to allow routing of optical signals (e.g., light 105) between the two dies. For example, in some embodiments, the opto-electronic assembly 106 may include two dies optically coupled together according to techniques and configurations described herein. For example, in the depicted embodiment, the opto-electronic assembly 106 includes a die 110 mounted on the substrate 104 and a die 108 optically coupled with the die 110. The die 110 may be, for example, a photonic die comprising a planar lightwave circuit (PLC) and/or optical components such one or more modulators (e.g., modulator 116) or detectors (e.g., detector 118). The photonic die may further include splitters, gratings, and the like (not shown). The die 108 may be a light-source die, which may be referred to as a "laser die" in some embodiments, and may include a light source to generate light for optical signaling. The light-source die can be any type of chip suitable for producing optical signals. The light-source die may include an array of lasers in some embodiments. In some embodiments, the light-source die may be a photonic die comprising a PLC and/or optical components such one or more modulators (e.g., modulator 116), detectors (e.g., detector 118), splitters, gratings, and the like.

The modulator 116 and the detector 118 are depicted in dashed form to indicate that they are disposed under the die 108 in the illustrated embodiment. In other embodiments, the die 108 may be mounted on the substrate 104 and the die 110 may be optically coupled with the die 108. Although the die 110 is depicted as larger than the die 108 in FIG. 1 for the sake of clarity, the dies 108, 110 may have different relative sizes in other embodiments. In some embodiments, die 108 or die 110 may be optically coupled with the connector element 112 and/or the system-level optical coupler 114. The connector element 112 may be mounted on the die having the light source in some embodiments.

The opto-electronic assembly 106 may be mounted on the substrate 104 in some embodiments (e.g., the die 110 may be mounted on the substrate 104). In other embodiments, the opto-electronic assembly 106 may be mounted on the processor 102 or components of the opto-electronic assembly 106 may be formed as part of the processor 102. According to various embodiments, the opto-electronic assembly 106 may comport with other embodiments described herein (e.g., opto-electronic assembly 200 or 300 of FIG. 2 or 3).

In some embodiments, the processor 102 may be configured to drive (e.g., indicated by arrow 101) one or more modulator devices (e.g., modulator 116) of the opto-electronic assembly 106. The modulator 116 may include, for example, a waveguide configured to modulate light 105 received from the die 108. The light 105 may be output from the modulator 116 to a connector element 112. The connector element 112 may include, for example, an optical plug or other coupler that further routes the light 105 from the opto-electronic assembly 106 over the system-level optical coupler 114 to the second processor-based system 150.

In some embodiments, the second processor-based system 150 is configured to send light 111 over the system-level optical coupler 114 to the first processor-based system 125. Although not shown, the second processor-based system 150 may be similarly equipped as the first processor-based system 125 or otherwise comport with embodiments described in connection with the first processor-based system 125. The light 111 sent by the second processor-based system 150 may be received by the connector element 112 of the first processor-based system 125. The connector element 112 may route the light 111 to one or more detectors (e.g., detector 118) of the opto-electronic assembly 106. The processor 102 may be configured to process electrical signals (e.g., indicated by arrow 103) generated by the opto-electronic assembly 106 based on the light 111 received at the detector 118.

The first processor-based system 125 and/or the second processor-based system 150 may include additional components in some embodiments. For example, the first processor-based system 125 and/or the second processor-based system 150 may comport with embodiments described in connection with the example system 1600 of FIG. 16. In other embodiments, techniques and configurations described herein can be used in a variety of systems that benefit from the principles described herein such as, for example, optical cables, optical links, optical sensors, network hubs, routers, optical backplanes, intra-chip optical links and the like.

Figure 2:
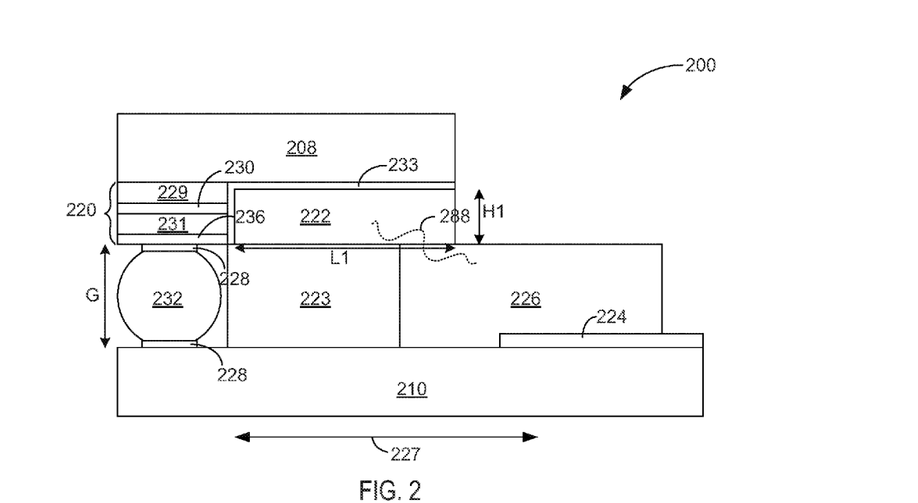
FIG. 2 schematically illustrates a cross-section side view of an opto-electronic assembly, in accordance with some embodiments.

FIG. 2 schematically illustrates a cross-section side view of an opto-electronic assembly 200, in accordance with some embodiments. The opto-electronic assembly 200 depicts electrical and optical coupling (e.g., evanescent coupling 288) of two dies, according to various embodiments. For example, the opto-electronic assembly 200 includes a substrate 208 of a first die (e.g., die 108 of FIG. 1) coupled with a substrate 210 of a second die (e.g., die 110 of FIG. 1), as can be seen. The substrate 208 may, for example, be a substrate of a laser die having a laser device 220 configured to emit light and the substrate 210 may be a substrate of a photonic die such as a die including a PLC. The substrates 208, 210 may be composed of a variety of suitable materials including, for example, silicon (Si), germanium (Ge), group III-V semiconductor materials such as indium phosphide (InP), gallium arsenide (GaAs), and/or group II-IV semiconductor materials, and the like.

The substrate 208 may be coupled with the substrate 210 in a flip-chip configuration in some embodiments. For example, a surface of the substrate 208 having active components may be bonded with a surface of the substrate 210 using one or more pads 228 and/or one or more interconnect structures (hereinafter "interconnect structure 232") such as, for example, a bump, post, ball, or similar feature. In some embodiments, the interconnect structure 232 may be electrically coupled with the laser device 220 to route electrical signals (e.g., I/O signals) from the substrate 210 (e.g., received from processor 102 of FIG. 1) to the laser device 220. The laser device 220 may be configured to convert the electrical signals to optical signals (e.g., light) or otherwise provide optical signals based on the electrical signals. The one or more pads 228 and/or interconnect structure 232 may be composed of any suitable electrically conductive material including, for example, a solderable material or a metal such as copper (Cu). The one or more pads 228 and/or interconnect structure 232 may be composed of other suitable materials in other embodiments. In some embodiments, a gap, G, as indicated between adjacent surfaces of the substrate 208 and the substrate 210 is 5 microns or less. The gap G may represent a chip-to-chip gap height in some embodiments. The gap, G, may have other values in other embodiments. During a solder joint reflow process, the surface of waveguide 222 meeting the surface of additional cladding material 223 and/or waveguide 226 may provide collapse control (e.g., stopping) for the gap G.

A laser device 220 and waveguide 222 may be disposed on the substrate 208, as can be seen. The laser device 220 may include, for example, a first cladding layer 229 coupled with the substrate 208, an active layer 230 coupled with the first cladding layer 229, and a second cladding layer 231 coupled with the active layer. Each of the first cladding layer 229, the active layer 230, and the second cladding layer 231 may include and/or represent multiple layers. For example, the first cladding layer 229, the active layer 230, and the second cladding layer 231 may each represent a stack of epitaxially coupled layers. The first cladding layer 229, the active layer 230, and the second cladding layer 231 may be epitaxially coupled together in some embodiments. The cladding layers 229, 231 may further include and/or represent additional layers such as buffer layers, contacting layers, and/or guiding layers in some embodiments.

The active layer 230 may be configured to emit light (e.g., in a direction indicated by arrow 227). In some embodiments, the active layer 230 may be composed of one or more quantum well (QR) or quantum dot (QD) layers. The cladding layers 229, 231 and the active layer 230 may be composed of a variety of suitable materials including, for example, semiconductor materials such as group III-V or II-VI semiconductor materials, and may include p-type or n-type material systems in some embodiments. In some embodiments, the layers 229, 230, 231 of the laser device 220 may be composed of various combinations of aluminum (Al), gallium (Ga), arsenic (As), indium (In), and phosphorous (P). Other suitable materials may be used in other embodiments.

A contact layer 236 may be disposed on the second cladding layer 231. The contact layer 236 may be composed of an electrically conductive material and configured to route electrical signals received through the interconnect structure 232 to control the laser device 220. In some embodiments, the contact layer 236 may be composed of a p-type metal such as, for example, titanium (Ti), platinum (Pt), or gold (Au). The contact layer 236 may include other suitable materials in other embodiments.

A waveguide 222 may be coupled with the substrate 208 in an area adjacent to the laser device 220, as can be seen. The waveguide 222 may be configured to route light from the laser device 220 to another waveguide 226 coupled with the substrate 210. For example, the waveguide 222 may be butt-coupled with the active layer 230 to receive and route light emitted from the laser device 220 to the waveguide 226 by evanescent coupling 288. In some embodiments, the waveguide 222 is a passive waveguide integrated with the laser device 220 according to techniques and configurations described herein. The waveguide 222 may be configured to be a spot size converter (SSC) to reduce beam divergence of the light received and/or routed from the active layer 230. In some embodiments, optical material of the waveguide 222 may have a height, H1, from 2 microns to 4 microns. The height, H1, may include other values in other embodiments.

A waveguide 226 may be disposed on the substrate 210, according to various embodiments. In the opto-electronic assembly 200 of FIG. 2, the waveguides 222, 226 may be configured to provide an optical pathway for the light via an evanescent field such as a Gaussian intensity distribution of the light from the first waveguide 222 to the second waveguide 226. Evanescent coupling 288 may include transmission of electromagnetic waves from one medium to another by means of an evanescent, exponentially decaying electromagnetic field. The evanescent coupling 288 may take place between the first waveguide 222 and the second waveguide 226 by means of the overlap of the evanescent wave between them. The waveguide 226 may further route the light to waveguide 224, which may be configured to further route the light.

The waveguides 222, 224, 226 may be composed of an optical material that is optically transparent at a wavelength of the light emitted by the laser device 220. In some embodiments, the waveguides 222, 226 may be composed of silicon oxynitride (SiON), a polymer material (e.g., planar or tapered), a photodefinable material, combinations thereof, or any other suitable material. The optical material of the waveguides 222, 226 may have an index of refraction from 1.4 to 2 in some embodiments, but is not limited in this regard, and may include other index of refraction values in other embodiments. The waveguides 222, 226 may each be a mode-expanding structure (referred to as "mode-expander waveguide").

The waveguide 224 may be evanescently coupled with the waveguide 226 to receive the light from the waveguide 226. The optical material of the waveguide 224 may have an index of refraction that is greater than the index of refraction of the optical material of the waveguide 222 and/or the waveguide 226. In some embodiments, the waveguide 224 may be composed of silicon (Si) or silicon nitride (SiN) and have an index of refraction from 1.9 to 3.5.

Waveguide cladding material 233 may be disposed between optical material of the waveguide 222 and the substrate 208, as can be seen. The waveguide cladding material 233 may further be disposed between optical material of the waveguide 222 and the laser device 220, as can be seen. In some embodiments, the waveguide cladding material 233 may provide an anti-reflection coating to a laser facet (e.g., laser facet 638 of FIG. 6) of the active layer 230 to facilitate increased light emission to the waveguide 222 from the active layer 230 without reflecting.

According to various embodiments, the waveguide cladding material 233 has a refractive index that is lower than a refractive index of the waveguide 222 optical material. In some embodiments, the waveguide cladding material 233 is composed of silicon oxide ($SiO_2$) or a polymer such as, for example, polyimide or a benzocyclobutene-based (BCB) polymer. In embodiments where the optical material of the waveguide 222 (e.g., and/or waveguide 226) includes SiON, the optical material and the waveguide cladding material 233 may have a refractive index difference from 0.01 to 0.5. In embodiments where the optical material of the waveguide 222 (e.g., and/or waveguide 226) includes a polymer (e.g., photodefinable), the refractive index of the of the polymer may range from 1.45 to 3.5 and the refractive index of the cladding materials may range from 1.4 to 3.45. Other suitable materials having other refractive indices may be used in other embodiments including, for example, air.

Additional cladding material 223 may be disposed between the substrate 210 and the waveguide 222 and coupled with the waveguide 226 to confine light as it is routed from waveguide 222 to waveguide 226. The cladding material 223 may have an index of refraction that is less than the index of refraction of the optical material of the waveguides 222, 226. In some embodiments, the cladding material 223 may be composed of an underfill material used in the assembly flow or a polymer such as, for example, a photoresist (e.g., SU-8). The cladding material 223 may be composed of other suitable materials in other embodiments.

Figure 3:
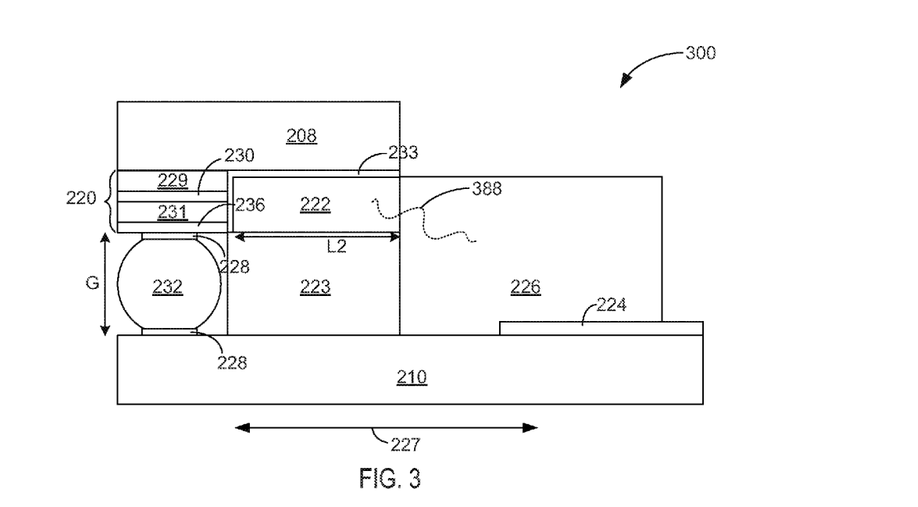
FIG. 3 schematically illustrates a cross-section side view of another opto-electronic assembly, in accordance with some embodiments.

FIG. 3 schematically illustrates a cross-section side view of another opto-electronic assembly 300, in accordance with some embodiments. The opto-electronic assembly 300 may comport with embodiments described in connection with the opto-electronic assembly 200 of FIG. 2, except that the opto-electronic assembly 300 may depict a waveguide 226 that is in a butt-coupling 388 configuration with the waveguide 222 instead of the evanescent coupling 288 depicted in FIG. 2.

Referring to FIGS. 2 and 3, a length, L1, of the waveguide 222 may be on the order of hundreds of microns (e.g., greater than or equal to 100 microns) for the evanescent coupling 288 configuration of FIG. 2. A length, L2, of the waveguide 222 may be on the order of tens of microns (e.g., less than 100 microns) for the butt-coupling 388 configuration of FIG. 3. A shorter length (e.g., L2) of the waveguide may provide cost savings by allowing reduction of a size of a laser die substrate (e.g., substrate 208) upon which the waveguide 222 is formed.

In some embodiments, the evanescent coupling 288 configuration provides an interface (e.g., horizontal interface) between the waveguides 222, 226 that forms a plane, the plane extending in a direction that is substantially parallel with a direction of light propagation from the laser device 220 (e.g., indicated by arrow 227). The butt-coupling 388 configuration may provide an interface between the waveguides 222, 226 that forms a plane, the plane extending in a direction that is substantially perpendicular with a direction of light propagation from the laser device 220.

The configuration of the waveguide 222 and/or waveguide 226 as described herein may allow lateral misalignment of the substrate 208 relative to the substrate 210 while still achieving low optical loss between the laser device 220 and optical features (e.g., PLC) on the substrate 210.

Figure 4A:
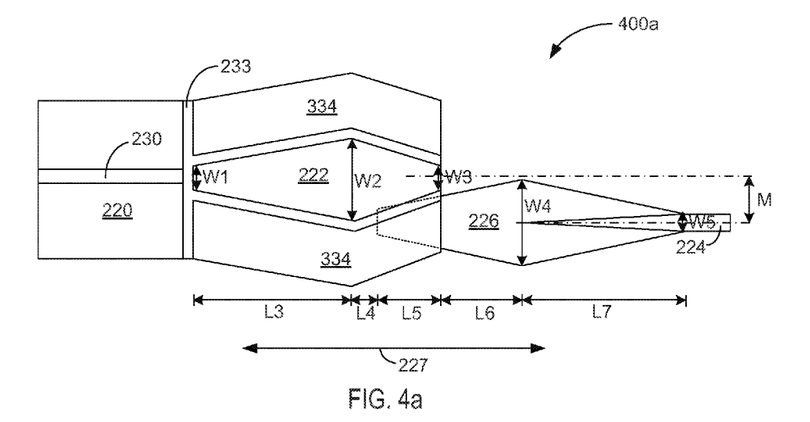
FIG. 4a schematically illustrates a top view of waveguide misalignment, in accordance with some embodiments.

FIG. 4a schematically illustrates a top view 400a of waveguide misalignment, in accordance with some embodiments. In some embodiments, the top view 400a depicts the evanescent coupling 288 of waveguides 222, 226 of the opto-electronic assembly 200 of FIG. 2, however, the substrates 208, 210 and other features (e.g., 223, 228, 232) have been omitted for the sake of clarity. Portions of the waveguide 226 are depicted in dashed form to indicate that portions of the waveguide 226 underlie other depicted features in the top view 400a. The waveguide 226 may include a waveguide cladding material (e.g., 233) and another material (e.g., 334) similar to the configuration depicted for waveguide 222 in some embodiments, however such features are omitted in FIG. 4a for the sake of clarity. Features depicted in the top view 400a may comport with embodiments described in connection with other figures (e.g., FIG. 2) having similarly labeled features.

In FIG. 4a, a laser device 220 may include an active layer 230 configured to emit light in a direction indicated by arrow 227. Waveguide 222 may be butt-coupled with the active layer 230 to receive the light from the laser device 220 and route the light to waveguide 226. A waveguide cladding material 233 may be disposed between the waveguide 222 and the laser device 220 and further disposed along an edge of the optical material of the waveguide 222 to confine light within the waveguide 222, as can be seen. Another material 334 may be disposed adjacent to or coupled with the waveguide cladding material 233, as can be seen. The material 334 may be composed of material of the substrate (e.g., substrate 208 of FIG. 2) upon which the waveguide 222 is formed. The material may include, for example, indium phosphide (InP) or gallium arsenide (GaAs), or other suitable materials described in connection with the substrate herein.

The waveguide 222 may have a tapered profile, as can be seen. In some embodiments, the waveguide 222 may be tapered, as depicted, to increase in width in a direction of light propagation (e.g., in a direction of arrow 227) over length, L3, and tapered to decrease in width in the direction of light propagation over lengths, L4 and L5 (or length L4+L5). For example, the waveguide 222 may have a width, W1, of 3 microns, a width, W2, of 8 microns, and a width, W3, of 2.5 microns. The length L3 may be 400 microns and the length L4+L5 may be 200 microns. The dimensions may vary based on materials used to fabricate the waveguides including cladding materials and the wavelength of light.

The waveguide 226 may have a similar tapered profile as waveguide 222. For example, the waveguide 226 may be tapered, as depicted, to increase in width in the direction of light propagation over length L5+L6 and tapered to decrease in width in the direction of light propagation over length L7. For example, the waveguide 226 may have a width, W4, of 8 microns and a width, W5, of 1.5 microns. In some embodiments, the waveguide 222 may overlap a length L5 of the waveguide 226, as can be seen.

The waveguide 226 may be configured to route light to waveguide 224. The waveguide 224 may be configured to receive and further route the light to other optical components (e.g., PLC) on a substrate. The waveguide 224 may have a tapered profile such that the waveguide 224 increases in width in the direction of light propagation over length L7, in some embodiments. For example, the waveguide 224 may have a width, W5, of 1.5 microns.

In some embodiments, length L3 has a value of 400 microns, length L4 has a value of 50 microns, length L5 has a value of 150 microns, length L6 has a value of 200 microns, and length L7 has a value of 400 microns. Other values for the widths W1, W2, W3, W4, W5 and lengths L3, L4, L5, L6, L7 can be used in other embodiments.

In some embodiments, a center axis of each of the waveguides 222, 226 may be laterally misaligned as depicted by a dimension, M (hereinafter "lateral misalignment M"). According to various embodiments, techniques and configurations described herein may allow opto-electronic assembly with a high misalignment tolerance in, e.g., flip-chip assembly processes. For example, in some embodiments a lateral misalignment M of 2 microns to 5 microns may provide an optical loss (e.g., insertion loss) of the light between the waveguides 222, 226 that is less than or equal to 3 decibels (dB).

Figure 4B:
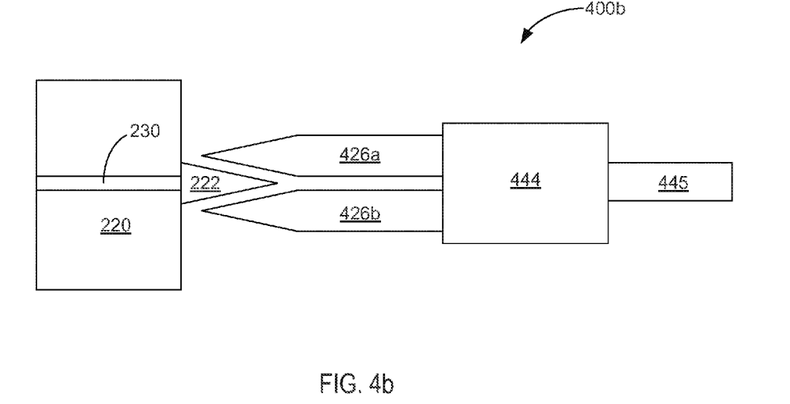
FIG. 4b schematically illustrates a top view of a waveguide configuration, in accordance with some embodiments.

FIG. 4b schematically illustrates a top view of a waveguide configuration 400b, in accordance with some embodiments. In the waveguide configuration 400b, the waveguide 222 may have a tapered configuration to route light from the active layer 230 of the laser device 220 to a pair of waveguides 426a, 426b (e.g., formed on the substrate 210 of FIG. 2). The pair of waveguides may have a tapered configuration, as can be seen, to receive light from the waveguide 222. In some embodiments, the pair of waveguides 426a, 426b may be evanescently coupled with the waveguide 222.

The waveguide configuration 400b may further include an optical coupler 444, which may be a multi-mode interference (MMI) coupler in some embodiments. The light of the pair of waveguides 426a, 426b may be combined in the optical coupler 444 and further routed by waveguide 445 in some embodiments. The waveguides 222, 426a, 426, 445 may have other shapes or profiles including those depicted in connection with waveguides 222 and 226 of FIG. 4a in other embodiments.

Figure 5:
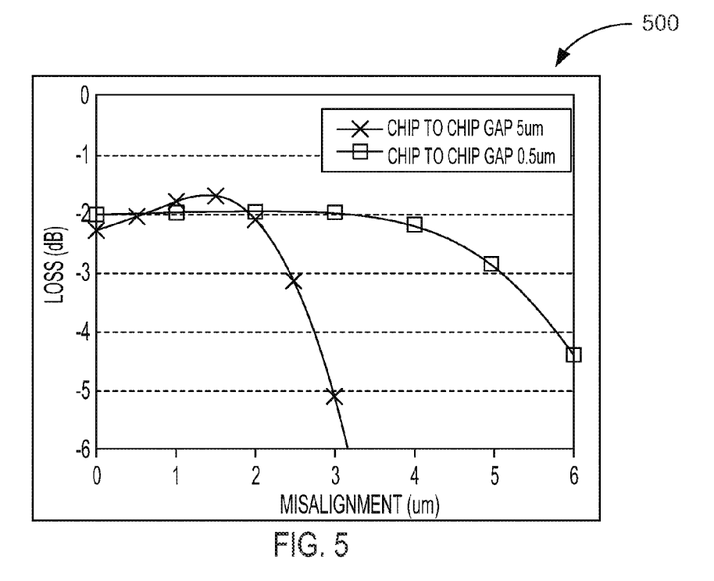
FIG. 5 schematically illustrates a graph of optical loss as a function of misalignment, in accordance with some embodiments.

FIG. 5 schematically illustrates a graph 500 of optical loss as a function of misalignment, in accordance with some embodiments. A laser die (e.g., substrate 208 of FIG. 2) configured with an integrated passive waveguide structure (e.g., waveguide 222 of FIG. 2) as described herein may allow light coupling from the laser die to another die (e.g., substrate 210 of FIG. 2) with high misalignment tolerance. As can be seen in the graph 500, an optical loss (e.g., insertion loss) of 3 dB or less can be achieved for an opto-electronic assembly having a lateral misalignment (e.g., lateral misalignment M of FIG. 4a) of about 5 microns or less and a chip to chip gap (e.g., gap G of FIG. 2) of 0.5 microns (um). An optical loss of 3 dB or less can be achieved for an opto-electronic assembly having a lateral misalignment of about 2.5 microns or less and a chip to chip gap of 5 microns.

Figure 8:
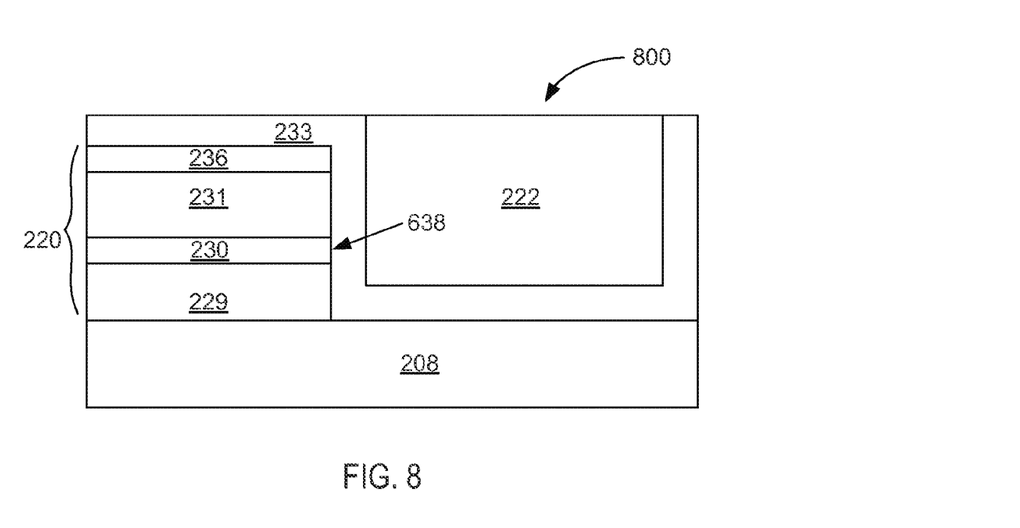
Figure 9:
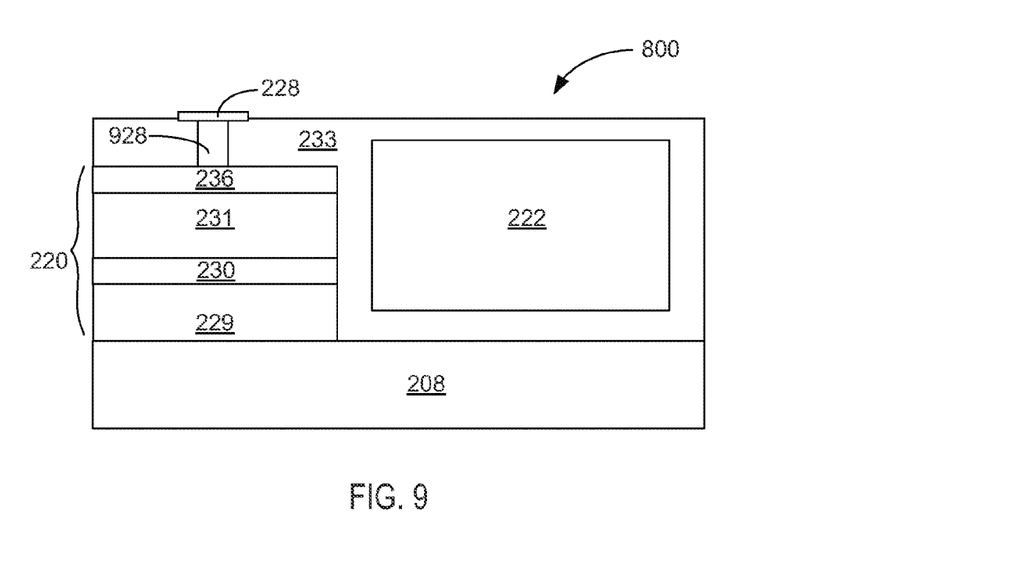
Figure 10:
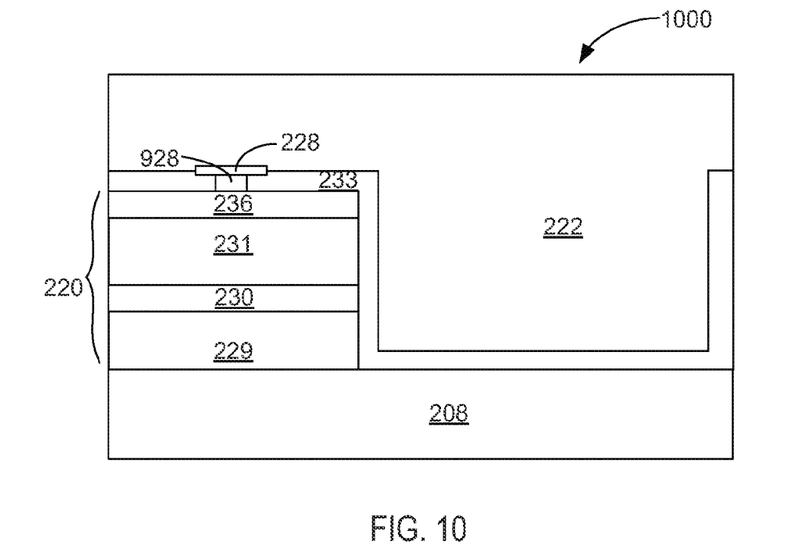
Figure 11:
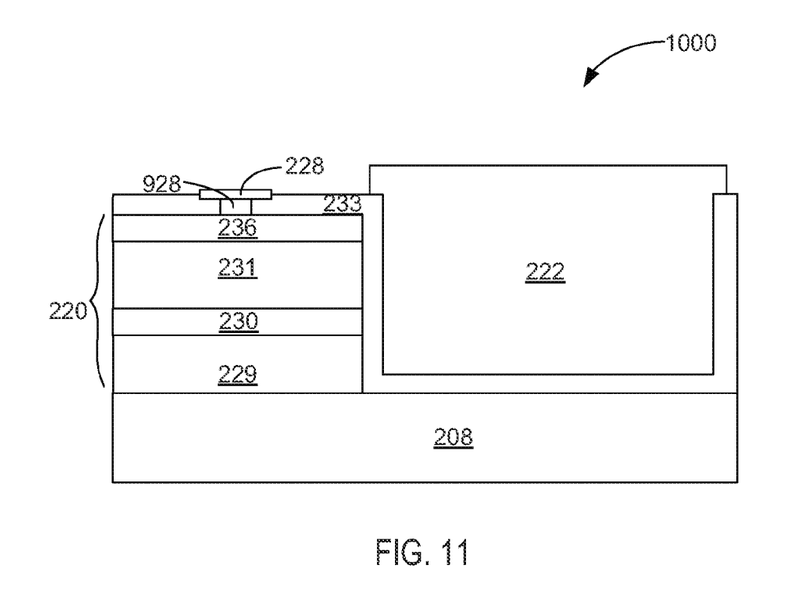
Figure 12:
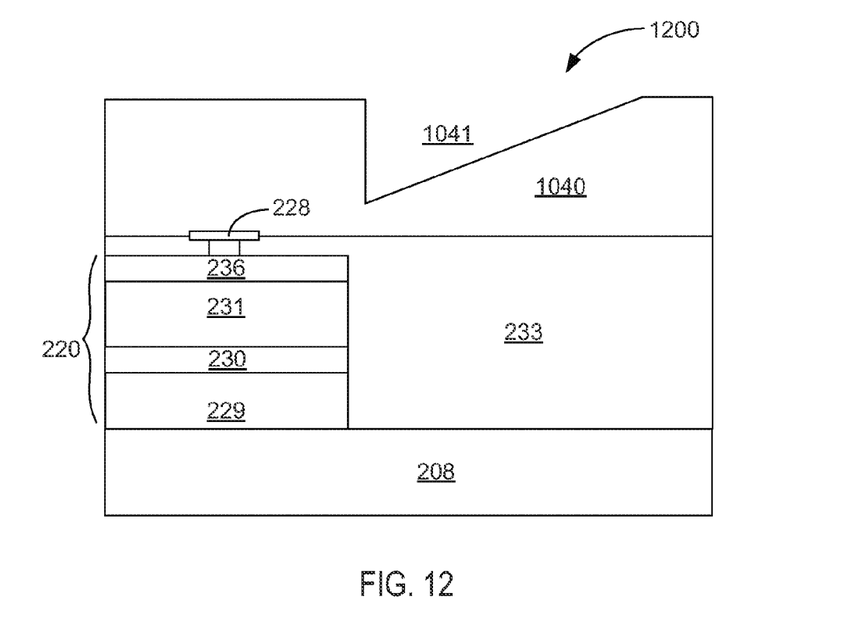
Figure 13:
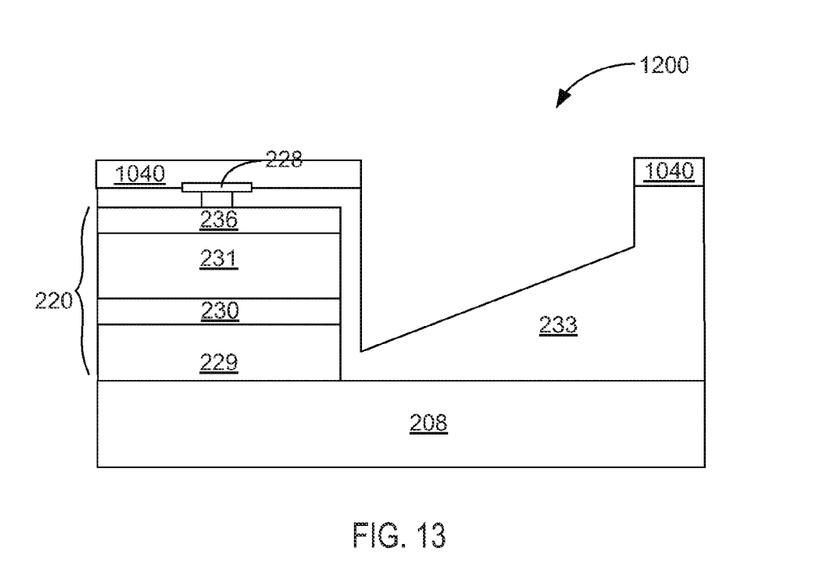
Figure 14:
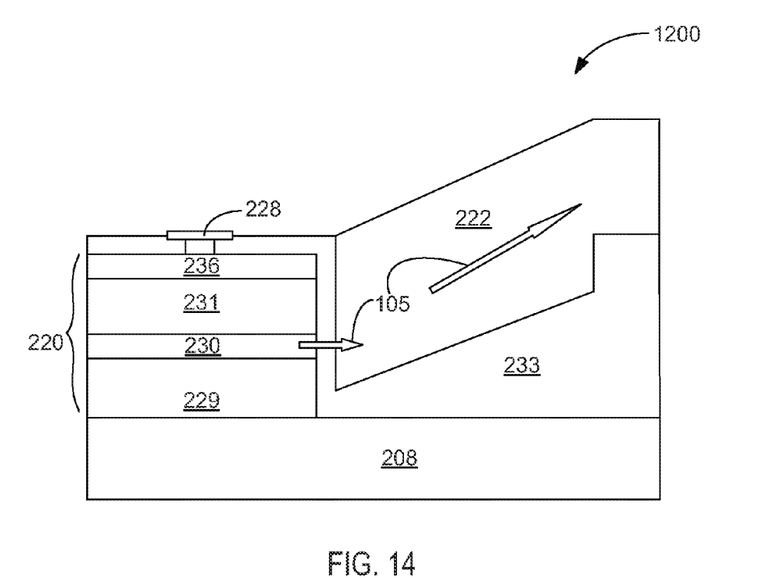

FIGS. 6-14 schematically illustrate a cross-section side view of waveguide (e.g., waveguide 222 of FIG. 2) fabrication on a substrate (e.g., substrate 208) having a laser device (e.g., laser device 220) formed thereon subsequent to various fabrication operations. FIGS. 6-9 depict fabrication of a waveguide 222 on a substrate 208 according to a first technique. FIGS. 10-11 depict fabrication of a waveguide 222 on a substrate 208 according to a second technique. FIGS. 12-14 depict fabrication of a waveguide 222 on a substrate 208 according to a third technique. Embodiments described in connection with FIGS. 6-14 may comport with embodiments described in connection with FIGS. 1-5 and vice versa.

Figure 6:
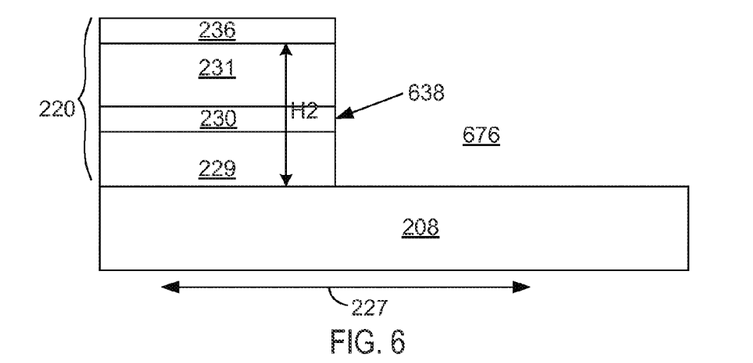
FIGS. 6-14 schematically illustrate a cross-section side view of waveguide fabrication on a substrate having a laser device formed thereon subsequent to various fabrication operations, in accordance with some embodiments.

In FIG. 6, waveguide fabrication is depicted subsequent to forming an epitaxial stack of layers (e.g., first cladding layer 229, active layer 230, and second cladding layer 231) on the substrate, depositing a contact layer 236 on the epitaxial stack of layers, and removing material of the epitaxial stack of layers to form a laser facet 638 and provide an area 676 where the waveguide 222 will be formed. The laser facet 638 may be a surface through which light from the laser device 220 is emitted when the laser device 220 is in operation.

The epitaxial stack of layers may be formed by epitaxially depositing a first cladding layer 229 on the substrate 208, an active layer 230 on the first cladding layer 229, and a second cladding layer 231 on the active layer. The layers of the epitaxial stack of layers may be deposited, for example, by molecular beam epitaxy (MBE), atomic layer epitaxy (ALE), chemical beam epitaxy (CBE), or metal-organic chemical vapor deposition (MOCVD), or combinations thereof. In some embodiments the epitaxial stack may include gratings to help select a single frequency of operation. Multiple epitaxial growths may be used in some embodiments. In some embodiments, the laser device 220 may be a distributed feedback (DFB) and/or distributed Bragg reflector (DBR) laser device. The contact layer 236 may be formed by depositing a metal such as, for example, a p-type metal on the epitaxial stack of layers (e.g., the second cladding layer 231) using any suitable deposition process such as, for example, sputtering, chemical vapor deposition (CVD), physical vapor deposition (PVD), or atomic layer deposition (ALD).

In some embodiments, the material of the epitaxial stack of layers is removed by an etch process such as, for example, a dry etch process. The dry etch process may remove a thickness, H2, of the material of the epitaxial stack of layers. The thickness H2 may range from 4 microns to 5 microns, in some embodiments. The thickness H2 may have other values in other embodiments. The laser facet 638 may be cleaned or further smoothed by a wet etch process in some embodiments.

Figure 7:
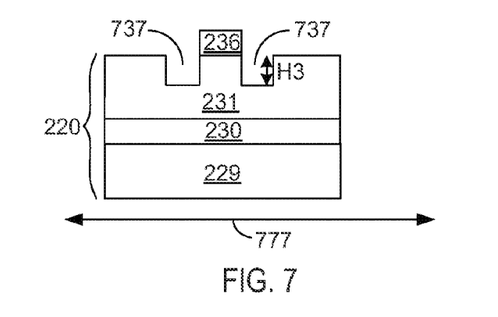

In FIG. 7, according to some embodiments, a patterning process including an etch process referred to as a "ridge etch" may be performed on the laser device 220 to remove material of the epitaxial stack of layers above the active layer 230. The cross-section side view depicts the laser device 220 from a perspective that is substantially perpendicular to the perspective of FIG. 6 (e.g., arrow 777 is perpendicular to arrow 227). The ridge etch may form one or more trenches 737 in the epitaxial stack of layers (e.g., in the second cladding layer 231). The one or more trenches 737 may be adjacent to the contact layer 236, as can be seen. In some embodiments, the one or more trenches 737 have a depth, H3, of about 1.5 microns. The depth H3 may have other values in other embodiments. The ridge structure formed by the one or more trenches 737 may facilitate the confinement of light in the laser device 220.

In FIG. 8, a laser/waveguide configuration 800 is depicted subsequent to forming a waveguide 222 on the substrate 208 adjacent to the laser device 220, as can be seen. The waveguide 222 may be formed by depositing a waveguide cladding material 233 on the substrate 208 and on surfaces of the laser device 220 (e.g., on the epitaxial stack of layers, contact layer 236 and laser facet 638), as can be seen. In some embodiments, the waveguide cladding material 233 is conformally deposited. In other embodiments the waveguide cladding material 233 may be deposited using planarizing techniques.

The waveguide 222 may be formed by depositing an optical material on the waveguide cladding material 233. The optical material of the waveguide 222 may be butt-coupled with the active layer 230 (e.g., laser facet 638), as can be seen.

According to various embodiments, the optical material of the waveguide 222 may be polished using, for example, a polishing/planarizing process such as a chemical mechanical polish (CMP) process that removes optical material of the waveguide 222 and provides a planar top surface of the waveguide 222, as can be seen. In such embodiments, the optical material may be a material amenable to polishing such as, for example, silicon oxynitride (SiON). The optical material of the waveguide 222 may include other materials in other embodiments.

In FIG. 9, the laser/waveguide configuration 800 is depicted subsequent to forming passivation and one or more interconnect features. For example, in some embodiments, waveguide cladding material (e.g., $SiO_2$) may be deposited on the waveguide 222 to encapsulate the optical material of the waveguide 222 or otherwise provide a passivation layer over the waveguide 222 and laser device 220. The one or more interconnect features may be formed by depositing electrically conductive material that is configured to electrically couple the contact layer 236 of the laser device 220 with a die interconnect structure (e.g., interconnect structure 232 of FIG. 2). For example, an electrical conduit 928 or "via" may be formed in the waveguide cladding material 233 and one or more pads 228 may be formed on the electrical conduit 928 to route electrical signals to or from the contact layer 236, as can be seen.

In FIG. 10, a laser/waveguide configuration 1000 is depicted subsequent to forming the laser device 220, the waveguide cladding material 233 and interconnect features (e.g., electrical conduit 928 and one or more pads 228) using techniques already described herein. An alternative technique for forming the waveguide 222 may include depositing an optical material (e.g., a polymer) on the waveguide cladding material. The optical material may be deposited, for example, using spin-on techniques or other techniques that provide thickness uniformity and/or a planar top surface, as can be seen. The electrical conduit 928 and the one or more pads 228 may be formed before or after deposition of the optical material to form the waveguide 222, according to various embodiments. The planarized surface of 208 may provide a flat surface for flip-chip assembly in accordance with techniques described in connection with FIG. 8 and FIG. 10.

In FIG. 11, the laser/waveguide configuration 1000 is depicted subsequent to removal of the optical material of the waveguide 222 from an area above the laser device 220. The optical material of the waveguide can be removed, for example, by a patterning process including, for example, lithography and/or etch processes. The optical material may be composed of a photodefinable polymer such as, for example, a negative photoresist in some embodiments. The optical material may be composed of other suitable materials in other embodiments. In some embodiments, the laser/waveguide configuration 1000 may be formed without using a polishing process (e.g., CMP) to planarize the optical material of the waveguide 222 at all.

In FIG. 12, a laser/waveguide configuration 1200 is depicted subsequent to forming the laser device 220, the waveguide cladding material 233 and interconnect features (e.g., electrical conduit 928 and one or more pads 228). As can be seen, the waveguide cladding material 233 may be deposited to substantially fill an area (e.g., area 676 of FIG. 6) where material of the epitaxial stack of layers is removed. A three-dimensional (3D) photo-definable material 1040 may be deposited on the waveguide cladding material 233 and patterned to remove material of the 3D photo-definable material 1040 in a region 1041 over the waveguide cladding material 233 such that the 3D photo-definable material 1040 has a tapered profile, as can be seen. The 3D photo-definable material 1040 may be patterned, for example, using a grayscale lithography process or other suitable technique.

In FIG. 13, the laser/waveguide configuration 1200 is depicted subsequent to an etch process that transfers the tapered profile of the 3D photo-definable material 1040 into the waveguide cladding material 233. In some embodiments, the etch process is a dry etch process.

In FIG. 14, the laser/waveguide configuration 1200 is depicted subsequent to removing the 3D photo-definable material 1040 (e.g., by a resist stripping process) and forming a waveguide 222 having a 3D configuration, as can be seen. According to various embodiments, the waveguide 222 is formed by depositing an optical material into the tapered profile of the waveguide cladding material 233 and patterning the optical material. The optical material may be composed of a 3D photo-definable material such as, for example, a positive tone material. The patterning of the optical material of the waveguide 222 may include grayscale lithography patterning techniques described herein. The waveguide 222 may have a tapered profile, as can be seen, to route light 105 from the laser device 220 in a direction away from a surface of the substrate 208 upon which the waveguide is formed.

The laser/waveguide configuration 1200 may provide a larger gap (e.g., gap G of FIG. 2) for interconnect structures (e.g., solder joints) between the substrate 208 and another substrate (e.g., substrate 210 of FIG. 2). In some embodiments, the interconnect features (e.g., electrical conduit 928 and one or more pads 228) may be formed subsequent to actions described in connection with FIG. 12, FIG. 13, or FIG. 14.

Figure 15:
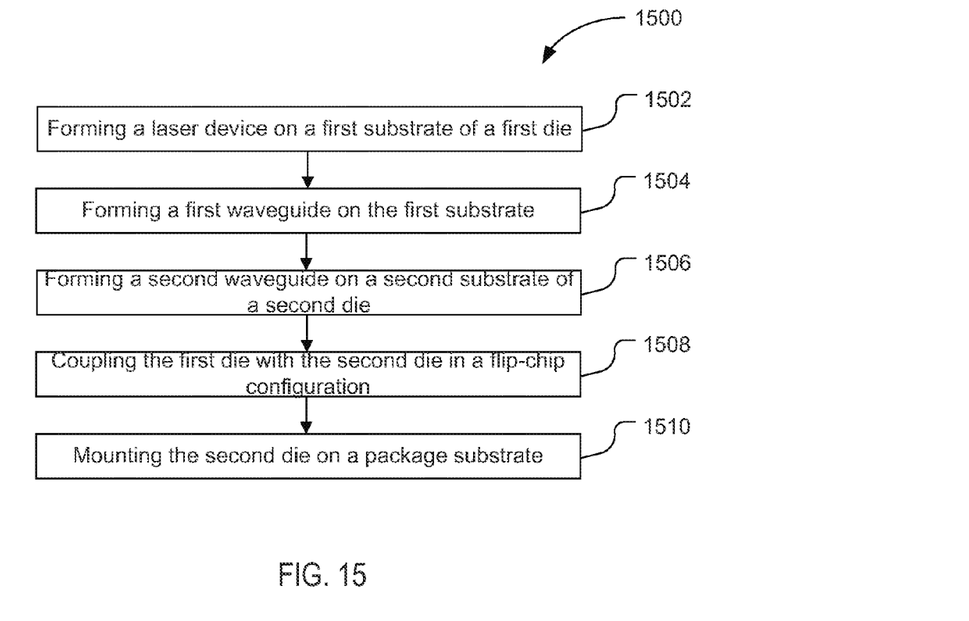
FIG. 15 is a flow diagram for a method of fabricating an opto-electronic assembly, in accordance with some embodiments.

FIG. 15 is a flow diagram for a method 1500 of fabricating an opto-electronic assembly (e.g., opto-electronic assembly 200 or 300 of FIG. 2 or 3), in accordance with some embodiments. The method 1500 may comport with techniques and configurations described in connection with FIGS. 1-14.

At 1502, the method 1500 includes forming a laser device (e.g., laser device 220 of FIG. 2 or 3) on a first substrate (e.g., substrate 208 of FIG. 2 or 3) of a first die (e.g., die 108 of FIG. 1). An array of laser devices may be formed on the first substrate in some embodiments. At 1504, the method 1500 may further include forming a first waveguide (e.g., waveguide 222 of FIG. 2 or 3) on the first substrate. At 1506, the method 1500 may further include forming a second waveguide (e.g., waveguide 226 of FIG. 2 or 3) on a second substrate (e.g., substrate 210 of FIG. 2 or 3) of a second die (e.g., die 110 of FIG. 1). The second waveguide may be fabricated according to techniques and configurations described in connection with waveguide 222 herein.

At 1508, the method 1500 may further include coupling the first die with the second die in a flip-chip configuration. An active side of each die may be coupled together such that the active side of the first die is facing the active side of the second die. The first die and the second die may be coupled such that the first waveguide and the second waveguide are optically coupled. For example, the second waveguide may be configured to receive and route light from the first waveguide.

In some embodiments, the first die and the second die are coupled by forming a plurality of bonds (e.g., solder joints) using a solder reflow process. In some embodiments, the solder reflow process is a solder self-alignment process that provides alignment of features on the first die and the second die. The solder self-alignment process may provide lateral alignment of the first waveguide relative to the second waveguide. In some embodiments, an optical loss of the light between the first die and the second die (e.g., between the first waveguide and the second waveguide) is 3 dB or less for up to 5 microns of lateral misalignment (e.g., lateral misalignment M of FIG. 4a) between the first waveguide and the second waveguide. In some embodiments, 2 microns to 5 microns of lateral misalignment of the first waveguide relative to the second waveguide provides an optical loss of the light between the first die and the second die of 3 decibels (dB) or less.

At 1510, the method 1500 may further include mounting the second die on a package substrate (e.g., substrate 104 of FIG. 1). The second die may be mounted on the package substrate using, for example, a surface mount technology (SMT) or any other suitable process.

Figure 16:
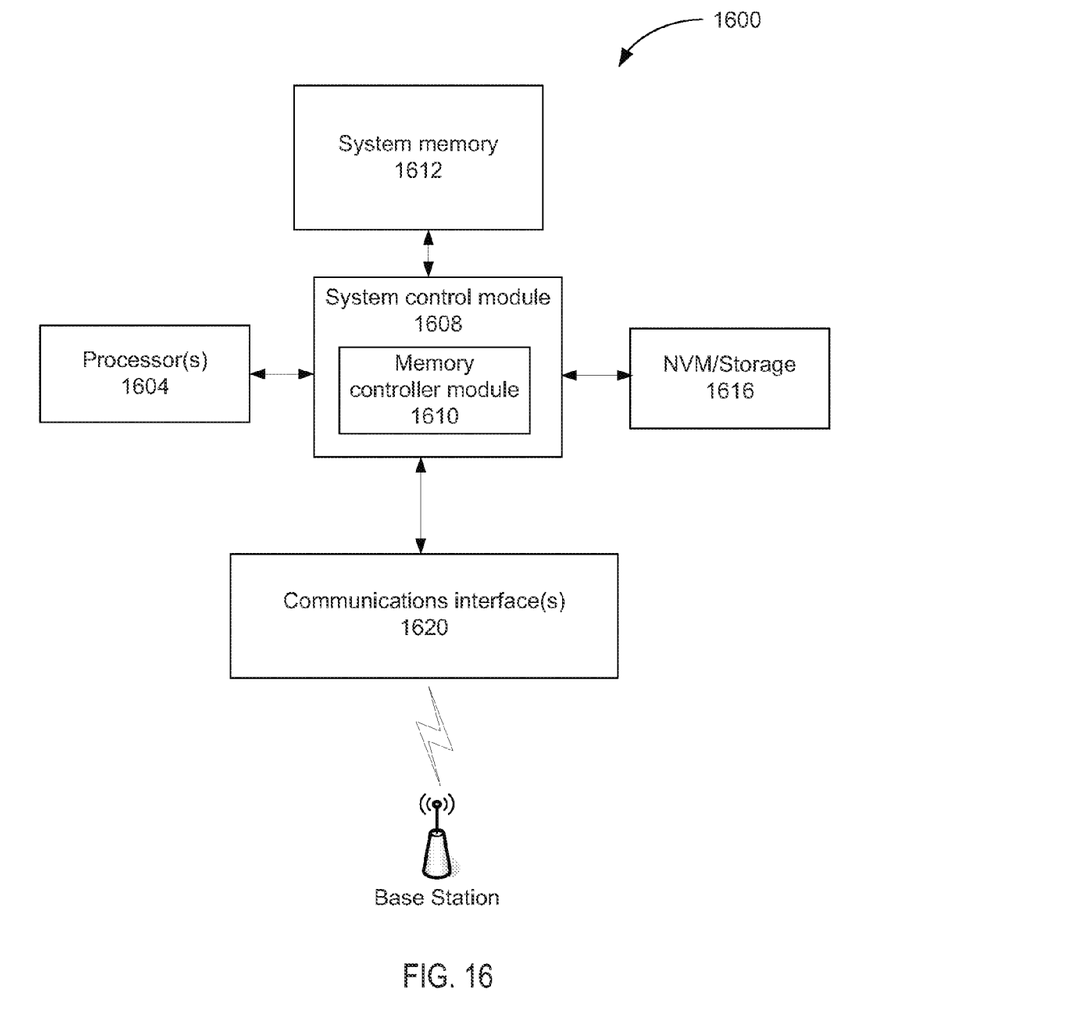
FIG. 16 schematically illustrates an example system that may be part of an optical interconnect system described herein in accordance with some embodiments.

Embodiments of the present disclosure may be implemented into a system using any suitable hardware and/or software to configure as desired. FIG. 16 schematically illustrates an example system (e.g., first or second processor-based system 125, 150 of FIG. 1) that may be part of an optical interconnect system (e.g., optical interconnect system 100 of FIG. 1) described herein in accordance with some embodiments. In one embodiment, the system 1600 includes one or more processor(s) 1604. One of the one or more processor(s) 1604 may correspond, for example, with the processor 102 of FIG. 1.

The system 1600 may further include system control module 1608 coupled to at least one of the processor(s) 1604, system memory 1612 coupled to system control module 1608, non-volatile memory (NVM)/storage 1616 coupled to system control module 1608, and one or more communications interface(s) 1620 coupled to system control module 1608.

System control module 1608 for one embodiment may include any suitable interface controllers to provide for any suitable interface to at least one of the processor(s) 1604 and/or to any suitable device or component in communication with system control module 1608.

System control module 1608 may include a memory controller module 1610 to provide an interface to system memory 1612. The memory controller module 1610 may be a hardware module, a software module, and/or a firmware module.

System memory 1612 may be used to load and store data and/or instructions, for example, for system 1600. System memory 1612 for one embodiment may include any suitable volatile memory, such as suitable Dynamic Random Access Memory (DRAM), for example.

System control module 1608 for one embodiment may include one or more input/output (I/O) controller(s) to provide an interface to NVM/storage 1616 and communications interface(s) 1620.

The NVM/storage 1616 may be used to store data and/or instructions, for example. NVM/storage 1616 may include any suitable non-volatile memory, such as Phase Change Memory (PCM) or flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example.

The NVM/storage 1616 may include a storage resource physically part of a device on which the system 1600 is installed or it may be accessible by, but not necessarily a part of, the device. For example, the NVM/storage 1616 may be accessed over a network via the communications interface(s) 1620.

Communications interface(s) 1620 may provide an interface for system 1600 to communicate over one or more wired or wireless network(s) and/or with any other suitable device. For example, in some embodiments, the communication interface(s) 1620 may be configured to communicate wirelessly over a wireless link established with a base station of a wireless communication network (e.g., radio access network (RAN) and/or core network). The communication interface(s) 1620 may be configured with a transmitter, receiver, or transceiver to wirelessly transmit/receive signals according to various communication protocols including, for example, broadband wireless access (BWA) networks including networks operating in conformance with one or more protocols specified by the $3^{rd}$ Generation Partnership Project (3GPP) and its derivatives, the WiMAX Forum, the Institute for Electrical and Electronic Engineers (IEEE) 802.16 standards (e.g., IEEE 802.16-2005 Amendment), long-term evolution (LTE) project along with any amendments, updates, and/or revisions (e.g., advanced LTE project, ultra mobile broadband (UMB) project (also referred to as "3GPP2"), etc.). The communication interface(s) 1620 may be configured to communicate using additional/alternative communication standards, specifications, and/or protocols. For example, the communication interface(s) 1620 may be configured to communicate with wireless local area networks (WLANs), wireless personal area networks (WPANs) and/or wireless wide area networks (WWANs) such as cellular networks (e.g., 2G, 3G, 4G, etc.) and the like.

For one embodiment, at least one of the processor(s) 1604 may be packaged together with logic for one or more controller(s) of system control module 1608, e.g., memory controller module 1610. For one embodiment, at least one of the processor(s) 1604 may be packaged together with logic for one or more controllers of system control module 1608 to form a System in Package (SiP). For one embodiment, at least one of the processor(s) 1604 may be integrated on the same die with logic for one or more controller(s) of system control module 1608. For one embodiment, at least one of the processor(s) 1604 may be integrated on the same die with logic for one or more controller(s) of system control module 1608 to form a System on Chip (SoC).

In various embodiments, the system 1600 may be, but is not limited to, a server, a workstation, a desktop computing device, or a mobile computing device (e.g., a laptop computing device, a handheld computing device, a handset, a tablet, a smartphone, a netbook, ultrabook, etc.). In various embodiments, the system 1600 may have more or less components, and/or different architectures. For example, in some embodiments, the system 1600 may include one or more of a camera, a keyboard, display such as a liquid crystal display (LCD) screen (including touch screen displays), non-volatile memory port, antenna or multiple antennas, graphics chip, application specific integrated circuit (ASIC), and speaker(s). In various embodiments, the system 1600 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
    a substrate;
    a laser device formed on the substrate, the laser device including an active layer configured to emit light; and
    a mode-expander waveguide disposed on the substrate and butt-coupled with the active layer to receive and route the light to a waveguide formed on another substrate, wherein the mode-expander waveguide includes a tapered configuration that provides a gradual increase of a waveguide width from a first value to a second value over a first length of the waveguide, followed by a gradual decrease of the waveguide width from the second value to a third value over a second length of the waveguide, the first and second lengths substantially forming a length of the waveguide.

2. The apparatus of claim 1, wherein the substrate comprises germanium (Ge), indium phosphide (InP), gallium arsenide (GaAs), or gallium nitride (GaN).

3. The apparatus of claim 1, wherein the laser device further includes:
    a first cladding layer disposed on the substrate; and
    a second cladding layer disposed on the active layer, wherein the active layer comprises a quantum well or quantum dot layer disposed between the first cladding layer and the second cladding layer.

4. The apparatus of claim 3, wherein the active layer, the first cladding layer, and the second cladding layer are part of an epitaxially coupled stack of layers of the laser device.

5. The apparatus of claim 4, further comprising:
    a contact layer formed on the epitaxially coupled stack of layers, the contact layer comprising an electrically conductive material;
    a pad coupled with the contact layer and configured to receive an interconnect structure to form a bond with the another substrate; and
    a waveguide cladding material disposed between the mode-expander waveguide and the substrate, the waveguide cladding material being further disposed between the mode-expander waveguide and the laser device.

6. The apparatus of claim 1, wherein the mode-expander waveguide is a passive waveguide that serves as a spot size converter (SSC) to reduce beam divergence of the light received and routed from the active layer.

7. The apparatus of claim 1, wherein the mode-expander waveguide comprises silicon oxynitride (SiON).

8. The apparatus of claim 1, wherein the mode-expander waveguide comprises a polymer.

9. The apparatus of claim 1, wherein the tapered configuration is configured to route the light in a direction away from a surface of the substrate upon which the mode-expander waveguide is disposed.

10. The apparatus of claim 1, wherein the substrate is a substrate of a laser die and the another substrate is a substrate of a planar lightwave circuit (PLC).

11. An opto-electronic assembly comprising:
    a first die comprising:
        a first substrate,
        a laser device formed on the first substrate, the laser device including an active layer configured to emit light, and
        a first waveguide disposed on the first substrate and butt-coupled with the active layer, the first waveguide including a tapered configuration, the configuration including a gradual increase of a first waveguide width from a first value to a second value over a first length of the first waveguide, followed by a gradual decrease of the first waveguide width from the second value to a third value over a second length of the first waveguide, the first and second lengths substantially forming a length of the first waveguide; and a second die comprising:
 a second substrate,
 a second waveguide disposed on the second substrate, the second waveguide being configured to receive and route the light from the first waveguide.

12. The opto-electronic assembly of claim 11, further comprising:
 cladding material coupled with the second substrate, the first waveguide, and the second waveguide, wherein the cladding material is disposed between the second substrate and the first waveguide.

13. The opto-electronic assembly of claim 12, wherein:
 optical material of the first waveguide and the second waveguide has an index of refraction from 1.4 to 2; and
 the cladding material has an index of refraction that is less than the index of refraction of the optical material of the first waveguide and the second waveguide.

14. The opto-electronic assembly of claim 11, further comprising:
 a third waveguide evanescently coupled with the second waveguide to receive the light from the second waveguide, wherein optical material of the third waveguide has an index of refraction that is greater than the index of refraction of the optical material of the first waveguide and the second waveguide.

15. The opto-electronic assembly of claim 11, wherein the first die is coupled with the second die in a flip-chip configuration.

16. The opto-electronic assembly of claim 15, further comprising:
 an interconnect structure coupled with the first die and the second die, wherein the interconnect structure is configured to route electrical signals between the second die and the laser device of the first die.

17. The opto-electronic assembly of claim 15, wherein the second die is mounted on a package substrate.

18. The opto-electronic assembly of claim 11, wherein the second waveguide is butt-coupled with the first waveguide.

19. The opto-electronic assembly of claim 11, wherein:
 a distance between adjacent surfaces of the first substrate and the second substrate is less than 5 microns;
 the first waveguide and the second waveguide are laterally misaligned by 2 microns to 5 microns; and
 an insertion loss of the light between the first waveguide and the second waveguide is 3 decibels (dB) or less.

20. The opto-electronic assembly of claim 11, wherein:
 the first die is a laser die; and
 the second die includes a planar lightwave circuit.

21. The opto-electronic assembly of claim 11, wherein:
 the second waveguide is one of a pair of waveguides having a tapered configuration to receive and route the light from the first waveguide.

* * * * *